United States Patent
Woods, Jr.

(10) Patent No.: US 11,777,208 B2
(45) Date of Patent: Oct. 3, 2023

(54) E-FUSE SWITCHED-DELAY PATH PHASED ARRAY

(71) Applicant: GlaiveRF, Inc., Burlington, MA (US)

(72) Inventor: Wayne H. Woods, Jr., Burlington, MA (US)

(73) Assignee: GLAIVERF, INC., Burlington, MA (US)

(*) Notice: Subject to any disclaimer, the term of this patent is extended or adjusted under 35 U.S.C. 154(b) by 0 days.

(21) Appl. No.: 17/326,893

(22) Filed: May 21, 2021

(65) Prior Publication Data

US 2022/0376390 A1 Nov. 24, 2022

(51) Int. Cl.
*H01Q 3/30* (2006.01)
*H01Q 3/34* (2006.01)
*H01P 1/18* (2006.01)

(52) U.S. Cl.
CPC .................................... *H01Q 3/34* (2013.01)

(58) Field of Classification Search
CPC ... H01P 1/18; H01P 3/08; H01P 3/081; H01Q 3/30; H01Q 3/34; H01Q 3/36; H01Q 3/38
See application file for complete search history.

(56) References Cited

U.S. PATENT DOCUMENTS

| | | | |
|---|---|---|---|
| 6,266,010 B1 * | 7/2001 | Ammar | H01Q 3/38 342/374 |
| 7,489,180 B2 | 2/2009 | Marshall | |
| 8,164,397 B2 | 4/2012 | Wang et al. | |
| 8,193,878 B2 | 6/2012 | Ding et al. | |
| 8,749,020 B2 | 6/2014 | Chen et al. | |
| 8,789,003 B1 | 7/2014 | Ding et al. | |
| 8,898,605 B2 | 11/2014 | Ding et al. | |
| 9,800,434 B2 | 10/2017 | Ding et al. | |
| 9,813,264 B2 | 11/2017 | Ding et al. | |
| 10,594,030 B2 * | 3/2020 | Lee | H01Q 3/2682 |
| 10,686,258 B2 | 6/2020 | Zihir et al. | |
| 11,038,281 B2 * | 6/2021 | Franson | H01Q 1/2283 |
| 11,063,353 B2 * | 7/2021 | Woods, Jr. | H01P 1/185 |
| 2008/0205551 A1 | 8/2008 | Lo et al. | |
| 2013/0127564 A1 | 5/2013 | Ding et al. | |
| 2016/0226142 A1 * | 8/2016 | Leroux | H01Q 3/38 |
| 2019/0089434 A1 | 3/2019 | Rainish et al. | |
| 2020/0373898 A1 | 11/2020 | Shapiro et al. | |

(Continued)

OTHER PUBLICATIONS

Robson et al., "Electrically Programmable Fuse (eFUSE): From Memory Redundancy to Autonomic Chips", IEEE 2007 Custom Intergrated Circuits Conference (CICC), 2007, 6 pages.

(Continued)

*Primary Examiner* — Tho G Phan
(74) *Attorney, Agent, or Firm* — Andrew M. Calderon; Calderon Safran & Cole, P.C

(57) ABSTRACT

A phase shifter element includes: a first signal path and a second signal path extending in parallel between an input node of the phase shifter element and an output node of the phase shifter element; at least one first signal path e-fuse in the first signal path; and at least one second signal path e-fuse in the second signal path. The phase shifter element is programmable to select one of the first signal path and the second signal path. The phase shifter element has a first phase shift when the first signal path is selected and a second phase shift, different than the first phase shift, when the second signal path is selected.

20 Claims, 10 Drawing Sheets

(56) References Cited

U.S. PATENT DOCUMENTS

2021/0083349 A1 3/2021 Woods, Jr.
2022/0166138 A1* 5/2022 Eshrah ............... H01Q 9/0414

OTHER PUBLICATIONS

Woods et al., "CMOS Millimeter Wave Phase Shifter Based on Tunable Transmission Lines", IEEE, 2013, 4 pages.
Tousi et al., "A Ka-band Digitally-Controlled Phase Shifter with sub-degree Phase Precision", 2016 IEEE Radio Frequency Integrated Circuits Symposium, 2016, 4 pages.
Sadhu et al., "A 28-GHz 32-Element TRX Phased-Array IC With Concurrent Dual-Polarized Operation and Orthogonal Phase and Gain Control for 5G Communications", IEEE Journal of Solid-State Circuits, vol. 52, No. 12, Dec. 2017, 19 pages.
Chen, "The Benefits Of Antifuse OTP", Semiconductor Engineering, Dec. 19, 2016, 10 pages.
Benson, "Phased Array Beamforming ICs Simplify Antenna Design", Analog Devices, Jan. 2019, 4 pages.
Anonymous, "Phased Array Antenna", Radar Basics, http://www.radartutorial.eu/06.antennas/Phased%20Array%20Antenna.en.html, Accessed Aug. 15, 2019, 3 pages.
EDN, "Metal eFuse teardown", https://www.edn.com/metal-efuse-teardown/, Nov. 11, 2015, 2 pages.
Iyer, "Implementation of electrically programmable fuse (eFUSE) in CMOS technologies using electromigration", Extended Abstracts of the 2002 International Conference on Solid State Devices and Materials, Nagoya, 2002, 2 pages.
International Search Report for International Patent Application No. PCT/US22/30274, dated Sep. 13, 2022, 2 pages.
Written Opinion of the International Searching Authority for International Patent Application No. PCT/US22/30274, dated Sep. 13, 2022, 5 pages.

* cited by examiner

E-FUSE SWITCHED-DELAY PATH PHASED ARRAY

BACKGROUND

The present invention relates generally to wireless communication systems and, more particularly, to a system that utilizes e-fuses in phase shifter elements of a phased array antenna to achieve a desired direction of a beam formed by the phased array antenna.

Phase shifters are a component of phased array antenna systems which are used to directionally steer radio frequency (RF) beams for electronic communications or radar. A phased array antenna is a group of antennas in which the relative phases of the respective signals feeding the antennas are varied in such a way that the effective radiation pattern of the array is reinforced in a desired direction and suppressed in undesired directions. The relative amplitudes of, and constructive and destructive interference effects among, the signals radiated by the individual antennas determine the effective radiation pattern of the array. By controlling the radiation pattern through the constructive and destructive superposition of signals from the different antennas in the array, phased array antennas electronically steer the directionality of the antenna system, referred to as beam forming or beam steering. In such systems, the direction of the radiation (i.e., the beam) can be changed by manipulating the phase of the signal fed into each individual antenna of the array, e.g., using a phase shifter.

Generally speaking, a phased array antenna can be characterized as an active beam steering system. Active beam steering systems have actively tunable phase shifters at each individual antenna element to dynamically change the relative phase among the elements and, thus, are capable of changing the direction of the beam plural times. Tunable transmission line (t-line) phase shifters are one way of implementing such actively tunable phase shifters. Tunable t-line phase shifters typically employ active elements, such as switches, that change the state of an element within the phase shifter to change the phase of the signal that is passing through the phase shifter.

SUMMARY

In a first aspect of the invention, there is a phase shifter element that includes: a first signal path and a second signal path extending in parallel between an input node of the phase shifter element and an output node of the phase shifter element; at least one first signal path e-fuse in the first signal path; and at least one second signal path e-fuse in the second signal path. The phase shifter element is programmable to select one of the first signal path and the second signal path. The phase shifter element has a first phase shift when the first signal path is selected and a second phase shift, different than the first phase shift, when the second signal path is selected.

In another aspect of the invention, there is a phased array antenna system that includes plural antennas each connected to one of plural phase shifters. Each of the plural phase shifter comprises plural phase shifter elements connected in series. Each respective one of the plural phase shifter elements includes: a first signal path and a second signal path extending in parallel between an input node of the respective phase shifter element and an output node of the respective phase shifter element; at least one first signal path e-fuse in the first signal path; and at least one second signal path e-fuse in the second signal path. Each respective one of the plural phase shifter elements is programmable to select one of the first signal path and the second signal path. Each respective one of the plural phase shifter elements has a first phase shift when the first signal path is selected and a second phase shift, different than the first phase shift, when the second signal path is selected.

In another aspect of the invention, there is a method including: determining a desired direction of a phased array antenna; and selectively blowing e-fuses in plural phase shifter elements in plural phase shifters of the phased array antenna to set respective phase shifts in the plural phase shifters to achieve the desired direction of the phased array antenna. Each respective one of the plural phase shifter elements is programmable to select one of a first signal path and a second signal path. The respective one of the plural phase shifter elements has a first phase shift when the first signal path is selected and a second phase shift, different than the first phase shift, when the second signal path is selected.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

Figure 1:
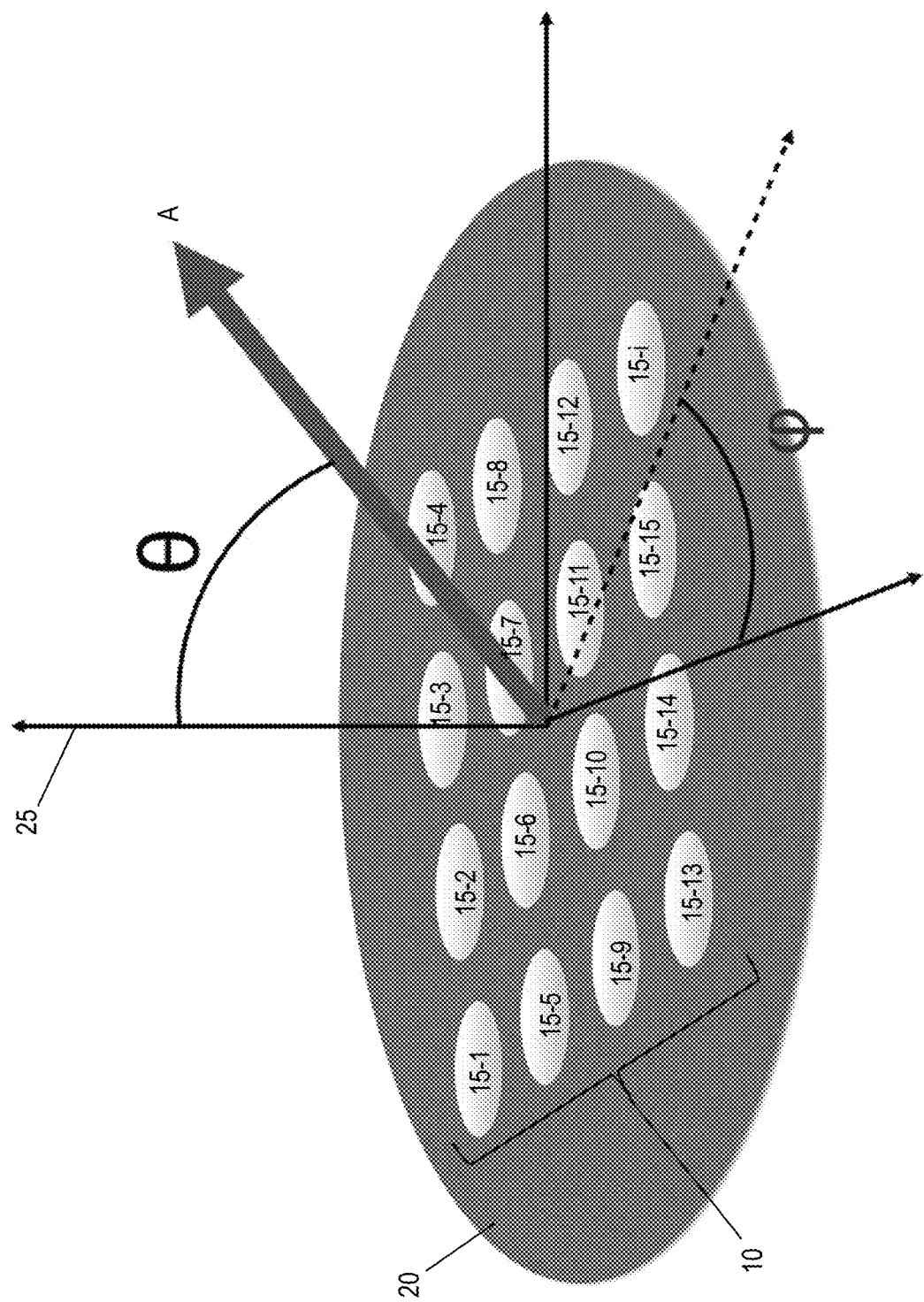
FIG. 1 shows an exemplary phased array antenna system that may be used with aspects of the invention.

The present invention relates generally to wireless communication systems and, more particularly, to a system that utilizes e-fuses in phase shifter elements of a phased array antenna to achieve a desired direction of a beam formed by the phased array antenna. According to aspects of the invention, selected e-fuses in phase shifter elements of a phased array antenna are blown to perform a one-time programming of the phase shifter elements, which results in a beam that is directed in a fixed direction. In embodiments, the system receives or obtains data that defines a desired direction of the beam, and then blows certain ones of the e-fuses to achieve a beam that is directed in the desired direction. In this manner, implementations of the invention achieve the benefits of beam steering without suffering the attenuation experienced in active beam steering systems.

Phase shifters are a key component of phased array antenna systems which are used to directionally steer radio frequency (RF) beams for electronic communications and radar. Many active phase shifters significantly attenuate signals passing through them by 6 to 8 dB at 60 GHz, which results in a factor of 4 to 8 signal reduction.

Beam steering advantageously increases the signal to noise ratio (SNR) of the antenna system up to an order of magnitude or more compared to antenna systems that do not employ beam steering. An increased SNR reduces the amount of power used by the antenna system to transmit the radiation to a receiving antenna, and also permits a higher bandwidth in communication. As a result, beam steering systems have become a focus of the next-generation wireless communication systems including 5G. For example, it is envisioned that 5G systems will utilize fixed-location base stations (e.g., antennas) that steer beams toward users' wireless devices (e.g., smartphones, etc.) on an as-needed basis.

However, some antenna systems contain power-sensitive sensors (or circuits) and do not need to steer the communication beam more than once after the antenna system is installed. For these applications, beam steering is desired to realize the advantageous SNR, but the power sacrifice (e.g., attenuation) of active beam steering systems (e.g., such as those employing tunable t-line phase shifters) is not acceptable within the design parameters. To address this need, embodiments of the invention utilize phase shifters that include one-time programmable e-fuses, such that the direction of a beam formed by a phased array antenna employing the phase shifters is set once, and only once, by selectively blowing certain ones of the e-fuses in the phase shifters. Aspects of the disclosure provide a system and method for blowing the appropriate e-fuses in an array of phased array phase shifter elements to achieve a desired polar and azimuth angle to maximize the SNR.

In accordance with aspects of the invention, the e-fuse phase shifters, and phased array systems that employ them, provide a large power consumption savings over actively tunable phase shifters. In some embodiments, the e-fuse phase shifters are automatically set by the system. In these embodiments, the phased array systems that employ them can be arbitrarily placed in an environment, and the beam can be self-directed to point in the direction of the nearest neighbor transceiver without having to be manually set (e.g., by a human or drone) when installing the system in the environment.

Embodiments include e-fuse switched delay path phased arrays including e-fuse controlled phase shifters that work in a fundamentally different way than other e-fuse controlled phase shifters which work by changing transmission line inductance and capacitance. Embodiments select one of two phases for each phase shifter element by selecting between one of two signal paths within the phase shifter element. Embodiments include e-fuses in each of the two signal paths, the e-fuses being capable of being blown to selectively disable either one of the signal paths within the phase shifter element. By utilizing e-fuses in the signal paths, with each of the signal paths having a different time delay that imparts a different phase change to the signal, embodiments do not need to change the inductance and capacitance of a signal line to achieve a phase change. As a result, embodiments do not require e-fuses in condition ground paths, and the characteristic impedance is not changed from that of the exiting delay lines.

By utilizing e-fuses in the signal paths, with each of the signal paths having a different time delay that imparts a different phase change to the signal, embodiments provide for a one-time setting of each phase shifter element of a phase shifter. In this manner, all the phase shifters in a phased array can be programmed one time to achieve a desired beam direction of the phased array. After setting the beam direction for an embodiment of a phased array in this manner, the phased array uses much less power than an actively tuned phased array. The use of lower power to operate the embodiment of a phased array is useful for low-power sensors and/or for fixed-direction 5G network elements (e.g., backhaul) components. Advantageously, embodiments do not need to be carefully set, and instead can be mounted in typical urban locations for 5G backhaul components, such as building roofs and light poles. In implementations, a finished product may have plural separate phased arrays utilizing the e-fuse controlled switched delay lines as described herein, with each one of the plural separate phased arrays being capable of being set one time, and only one time, for a desired beam direction. In this manner, a finished product may be set with a first beam direction using a first one of the plural separate phased arrays at a first time, then at a second time the first one of the plural separate phased arrays maybe disabled and the finished product may be set with a second beam direction (different than the first beam direction) using a second one of the plural separate phased arrays, and so on. In this manner, the beam direction may be changed a finite number of times, equal to the number of the plural separate phased arrays, based on changing needs of the finished product. Advantageously, the cost and setup of the finished product according to aspects of the invention is quicker than other fixed direction components because alignment of the finished product according to aspects of the invention does not need to be carefully set by a skilled technician.

Embodiments employ metallic e-fuses to reduce RF power loss compared to doped polysilicon e-fuses that have much larger resistances compared to metallic e-fuses. As a result of using metallic connections and metallic e-fuses in embodiments, the resistive loss due to the presence of the e-fuses is less than 10 Ohms for a 180 degrees phase shifter. The resultant total loss of the phase shifter in this regard can be less than 2 dB for a 180 degrees phase shift, which is better than 90 degrees phase change per dB of loss, which is 4 times less power loss than an active tunable transmission line phases shifter that has 8 dB of loss on 180 degrees of phase shift at 28 GHz. In this manner, implementations of the invention greatly reduce the power loss in the phase shifters compared to active tunable phases shifters, meaning that implementations of the invention require less power to operate compared to active tunable phases shifters.

FIG. 1 shows an exemplary phased array antenna system that may be used with aspects of the invention. In the example shown in FIG. 1, the phased array antenna system 10 comprises a 4×4 array of antenna elements 15-1, 15-2, ..., 15-*i* included in a coin-shaped sensor 20. In this example "i" equals sixteen; however, the number of antenna elements shown in FIG. 1 is not intended to be limiting, and the phased array antenna system 10 may have a different number of antenna elements. Similarly, the implementation in the coin-shaped sensor 20 is only for illustrative purposes, and the phased array antenna system 10 may be implemented in different structures.

Still referring to FIG. 1, the arrow A represents a direction of the beam that is formed by the phased array antenna system 10 using constructive and destructive superposition of signals from the antenna elements 15-1, 15-2, . . . , 15-i using beam steering principles. Angle θ represents the polar angle and angle φ represents the azimuth angle of the direction of the arrow A relative to a frame of reference 25 defined with respect to the phased array antenna system 10.

Figure 2:
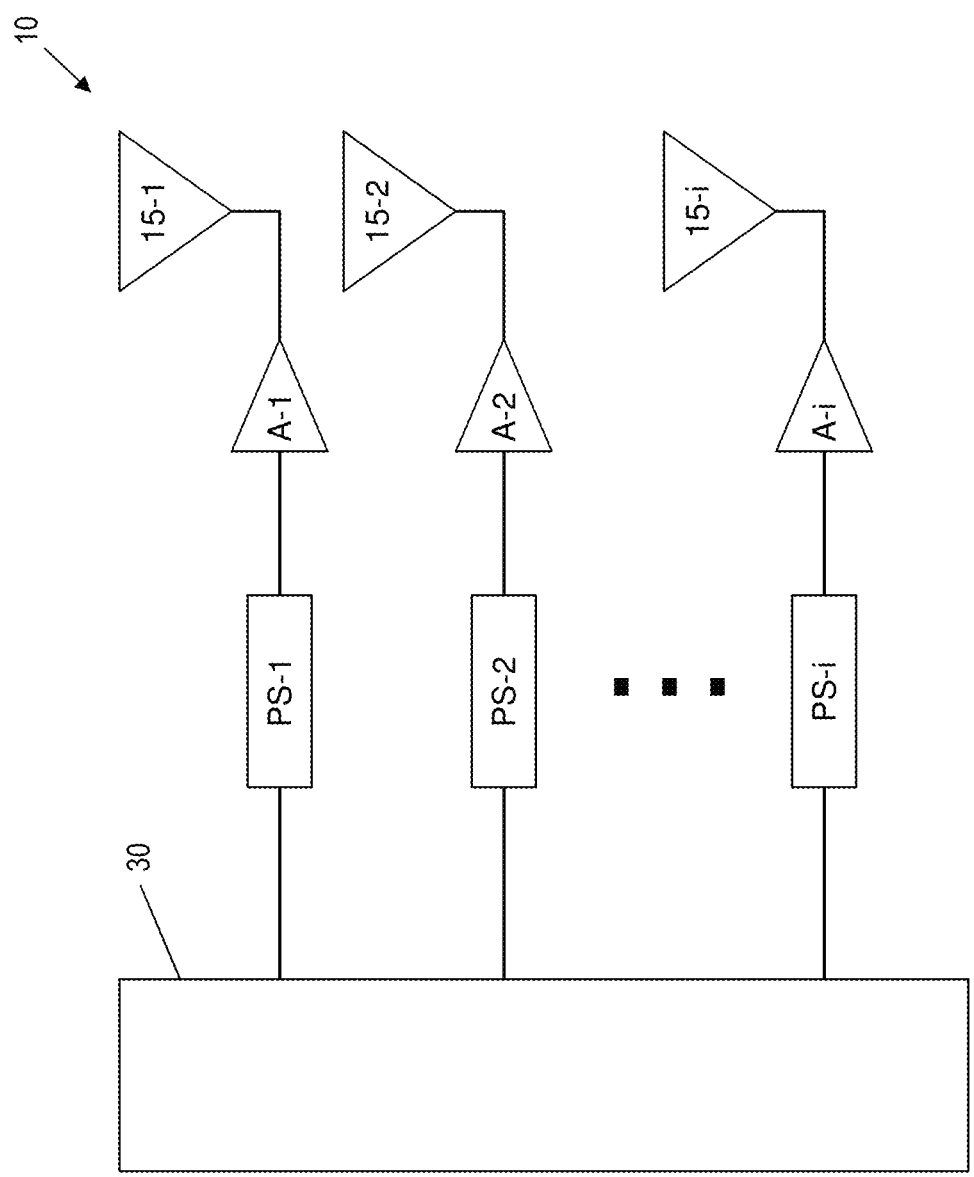
FIG. 2 shows a block diagram of an arrangement of components within the phased array antenna system.

FIG. 2 shows a block diagram of an arrangement of components within the phased array antenna system 10 in accordance with aspects of the invention. In embodiments, a respective phase shifter PS-1, PS-2, . . . , PS-i and amplifier A-1, A-2, . . . , A-i are connected to each respective one of the antenna elements 15-1, 15-2, . . . , 15-i. In particular embodiments, the respective phase shifter PS-1, PS-2, . . . , PS-i and amplifier A-1, A-2, . . . , A-i are connected in series upstream of the respective one of the antenna elements 15-1, 15-2, . . . , 15-i as shown in FIG. 2. In implementations, a respective transmission signal is provided to each of the phase shifters PS-1, PS-2, . . . , PS-i, e.g., from a power splitter 30 such as multiple Wilkinson power dividers. A respective phase shifter (e.g., PS-i) shifts the phase by a predefined amount, the amplifier (A-i) amplifies the phase shifted signal, and the antenna element (15-i) transmits the amplified and phase shifted signal.

Figure 3:
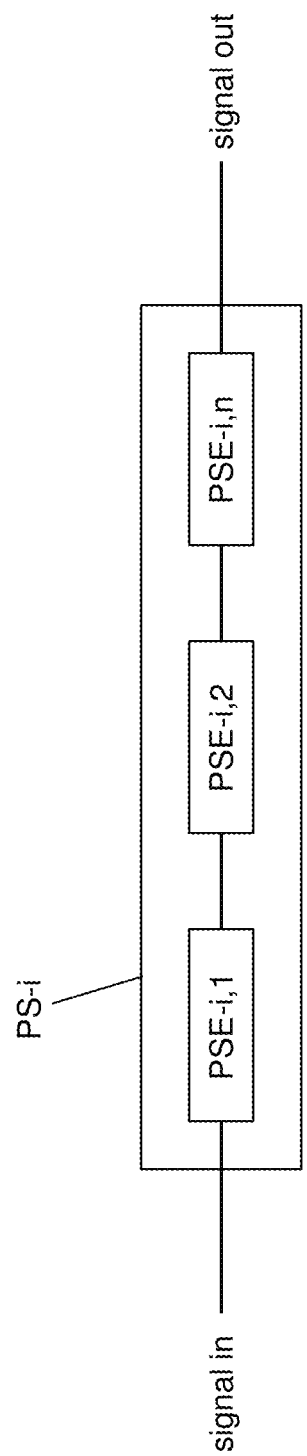
FIG. 3 shows a block diagram of an arrangement of phase shifter elements within a respective one of the phase shifters in accordance with aspects of the invention.

FIG. 3 shows a block diagram of an arrangement of phase shifter elements PSE-i,1, PSE-i,2, . . . , PSE-i,n within a respective one of the phase shifters PS-i in accordance with aspects of the invention. In embodiments, the phase shifter elements PSE-i,1, PSE-i,2, . . . , PSE-i,n are electrically connected in series in the phase shifter PS-i as depicted in FIG. 3. The number "n" of phase shifter elements may be any desired number. In a particular embodiment n=5; however, other numbers of phase shifter elements may be used in implementations of the invention.

Phase shifter elements PSE-i,1, PSE-i,2, . . . , PSE-i,n in a single phase shifter PS-i can be controlled to provide a delay state, i.e., to impart a predefined phase shift on the signal passing through the phase shifter elements. In this manner, each one of the phase shifters PS-1, PS-2, . . . , PS-i can be individually configured, by appropriately controlling its phase shifter elements to achieve a desired phase shift for the signal that is provided to its associated antenna element, such that the combination of signals emitted by the respective antenna elements 15-1, 15-2, . . . , 15-i forms a beam in a desired direction A as shown in FIG. 1.

FIGS. 1-3 show one exemplary system that may be used as a phased array antenna system 10 in accordance with aspects of the invention. Implementations of the invention are not limited to what is shown in FIGS. 1-3, however, and other conventional or later-developed beam steering systems may be used in embodiments.

Figure 4:
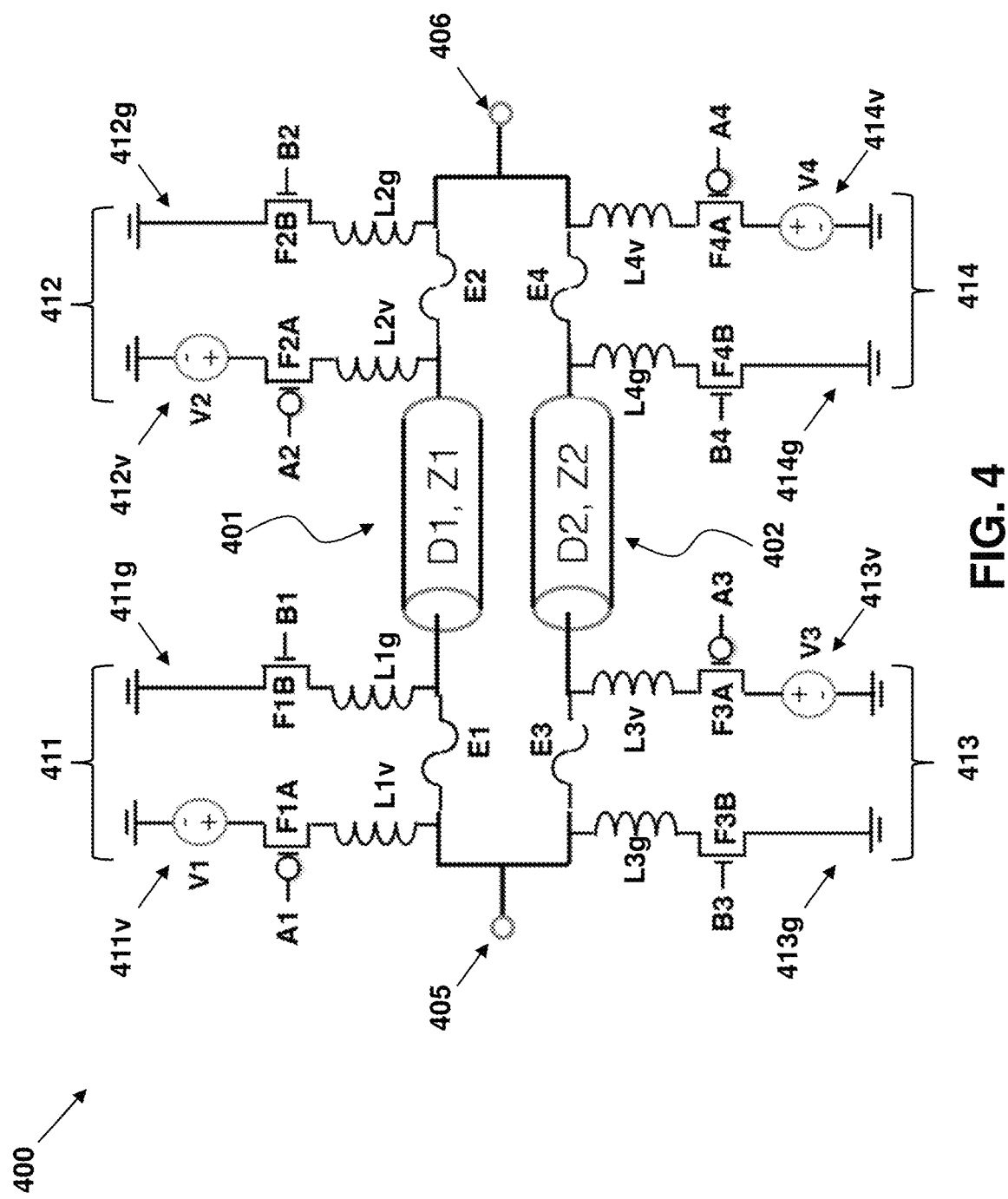
FIG. 4 shows a schematic diagram of a representative one of the phase shifter elements in accordance with aspects of a first embodiment.

FIG. 4 shows a schematic diagram of a representative phase shifter element 400 in accordance with aspects of a first embodiment. A respective instance of the phase shifter element 400 may be used as each one of the phase shifter elements PSE-i,1, PSE-i,2, . . . , PSE-i,n of FIG. 3.

In accordance with aspects of the invention, the phase shifter element 400 is a two-path, e-fuse controlled switched-delay line phase shifter element. In embodiments, the phase shifter element 400 comprises a first signal path 401 and a second signal path 402 extending between an input node 405 and an output node 406. In a particular embodiment, the first signal path 401 and a second signal path 402 are arranged in parallel to one another between the nodes 405, 406.

The first signal path 401 has a first delay D1 and a first characteristic impedance Z1. The second signal path 402 has a second delay D2 and a second characteristic impedance Z2. In embodiments, the first characteristic impedance Z1 is substantially equal to the second characteristic impedance Z2, e.g., within a tolerance of less than 1% difference. In a particular example, Z1=Z2=50 Ohms.

According to aspects of the invention, the first delay D1 is different than the second delay D2, delay being the time required for a signal to travel along the respective path from the first node 405 to the second node 406. In embodiments, the difference between D1 and D2 is achieved by making the paths 401 and 402 have different physical lengths. In one example, each path 401 and 402 has identical physical characteristics per unit length (e.g., type of line, cross section, material, etc.), and the paths 401 and 402 have different physical lengths. In this example, due to the identical physical characteristics per unit length and different physical lengths, it would take a signal a first amount of time to travel between nodes 405 and 406 along first path 401, and it would take the same signal a second amount of time, different than the first amount of time, to travel between nodes 405 and 406 along second path 402. The paths 401 and 402 may be constructed using microstrip, stripline, coplanar waveguide (CPW), or slow-wave transmission lines, for example. The paths 401 and 402 may be formed in a layered semiconductor structure or a printed circuit board, for example. In a particular embodiment, the paths 401 and 402 are specifically structured and arranged to transmit RF signals used in RF communication systems.

Still referring to FIG. 4, in accordance with aspects of the invention, the phase shifter element 400 is programmable using e-fuses to select one of paths 401 and 402 for carrying a signal between nodes 405 and 406. In embodiments, each path 401 and 402 comprises at least one e-fuse in the path that, when blown, creates a physical discontinuity in the path and, thus, creates an electrical discontinuity in the path between the nodes 405 and 406. The phase shifter element 400 can be programmed to select path 401 by blowing the at least one e-fuse in path 402 and not blowing the at least one e-fuse in the path 401. Alternatively, the phase shifter element 400 can be programmed to select path 402 by blowing the at least one e-fuse in path 401 and not blowing the at least one e-fuse in the path 402. Since the different paths 401 and 402 have different delay values D1 and D2, the act of selecting one path comprises selecting one of the different delay values for this particular phase shifter element. When plural ones of the phase shifter elements 400 are arranged in series, e.g., the respective phase shifter elements 400 corresponding to respective ones of the phase shifter elements PSE-i,1, PSE-i,2, . . . , PSE-i,n in a phase shifter PS-i of FIG. 3, each of the respective phase shifter elements 400 can be individually programmed to provide a predefined amount of delay for the phase shifter PS-i as a whole. Moreover, because phase change of a signal is a function of the delay, the phase shifter PS-i using plural phase shifter elements 400 can be programmed to provide a predefined amount of phase change to a signal based on the predefined amount of delay.

With continued reference to FIG. 4, in embodiments the first path 401 includes first e-fuse E1, a second e-fuse E2, first control lines 411, and second control lines 412. The control lines 411, 412 are formed using electrically conductive material, such as metal in a layered semiconductor structure or a printed circuit board, for example. In this example, the first control lines 411 include voltage line 411v and ground line 411g, with the first e-fuse E1 connected in series between the voltage line 411v and the ground line 411g. In this example, the voltage line 411v includes a DC (direct current) voltage source V1, a switch F1A (which may be a semiconductor field effect transistor, e.g., FET) that is controlled by a signal A1, and an inductor L1v. In this example, the ground line 411g includes a switch F1B (e.g., a FET) that is controlled by a signal B1, and an inductor L1g. In this configuration, the first e-fuse E1 may be blown (e.g., broken) by turning on the switches F1A and F1B, thereby allowing current to flow from DC voltage source V1, through the first e-fuse E1, and to ground in the ground line 411g. The magnitude of DC voltage source V1 is configured to create a current that is sufficient to blow the first e-fuse E1 when the switches F1A and F1B are on. After blowing the first e-fuse E1, the switches F1A and F1B are turned off. In this manner, the first e-fuse E1 may be blown by controlling the switches F1A and F1B via the respective control signals A1 and B1.

Still referring to the example shown in FIG. 4, in embodiments the second control lines 412 include voltage line 412v and ground line 412g, with the second e-fuse E2 connected in series between the voltage line 412v and the ground line 412g. In this example, the voltage line 412v includes a DC voltage source V2, a switch F2A (e.g., a FET) that is controlled by a signal A2, and an inductor L2v. In this example, the ground line 412g includes a switch F2B (e.g., a FET) that is controlled by a signal B2, and an inductor L2g. In this example, the switches F2A and F2B may be selectively turned on and off (e.g., in a manner similar to that described with respect to the switches F1A and F1B of first control lines 411) to blow the second e-fuse E2.

Still referring to the example shown in FIG. 4, in embodiments the second path 402 includes third e-fuse E3, a fourth e-fuse E4, third control lines 413, and fourth control lines 414. The control lines 413, 414 are formed using electrically conductive material, such as metal in a layered semiconductor structure or a printed circuit board, for example. In this example, the third control lines 413 include voltage line 413v and ground line 413g, with the third e-fuse E3 connected in series between the voltage line 413v and the ground line 413g. In this example, the voltage line 413v includes a DC voltage source V3, a switch F3A (e.g., a FET) that is controlled by a signal A3, and an inductor L3v. In this example, the ground line 413g includes a switch F3B (e.g., a FET) that is controlled by a signal B3, and an inductor L3g. In this example, the switches F3A and F3B may be selectively turned on and off (e.g., in a manner similar to that described with respect to the switches F1A and F1B of first control lines 411) to blow the third e-fuse E3.

Still referring to the example shown in FIG. 4, in embodiments the fourth control lines 414 include voltage line 414v and ground line 414g, with the fourth e-fuse E4 connected in series between the voltage line 414v and the ground line 414g. In this example, the voltage line 414v includes a DC voltage source V4, a switch F4A (e.g., a FET) that is controlled by a signal A4, and an inductor L4v. In this example, the ground line 414g includes a switch F4B (e.g., a FET) that is controlled by a signal B4, and an inductor L4g. In this example, the switches F4A and F4B may be selectively turned on and off (e.g., in a manner similar to that described with respect to the switches F1A and F1B of first control lines 411) to blow the fourth e-fuse E4.

Still referring to the example shown in FIG. 4, in embodiments the phase shifter element 400 can be programmed one time to select either path 401 or path 402. To select path 401, the third e-fuse E3 and fourth e-fuse E4 are blown in the manner described herein, and the first e-fuse E1 and the second e-fuse E2 are not blown. In this manner, path 401 extends continuously between nodes 405 and 406, while path 402 has discontinuities where the third e-fuse E3 and fourth e-fuse E4 are blown. Conversely, to select path 402, the first e-fuse E1 and the second e-fuse E2 are blown in the manner described herein, and the third e-fuse E3 and fourth e-fuse E4 are not blown. In this manner, path 402 extends continuously between nodes 405 and 406, while path 401 has discontinuities where the first e-fuse E1 and the second e-fuse E2 are blown. In this manner, the phase shifter element 400 can be programmed one time to select a first delay value (e.g., D1 of path 40) or a second delay value (e.g., D2 of path 402). In embodiments, the system includes control circuitry that is configured to control the signals A1-A4 and B1-B4 to program the phase shifter element 400. The control circuitry may be included in a phased array antenna system 10 that includes the phase shifter element 400.

In embodiments, each of the inductors L1v, L2v, L3v, L4v, L1g, L2g, L3g, L4g is a radio frequency (RF) choke inductor that is configured to permit DC current to pass through the inductor and block high-frequency (e.g., RF) signals from passing through the inductor. In this manner, the inductors permit passage of the DC current that is used to blow the e-fuses, but block an RF signal (that is moving along one of the paths 401 and 402 between the nodes 405 and 406) from going down any of the control lines 411, 412, 413, 414. Implementations are not limited to using inductors, though, and any type of low-pass filter (extending to DC) may be used so long as the filter permits passage of the DC current and prevents passage of an RF signal.

Figure 5:
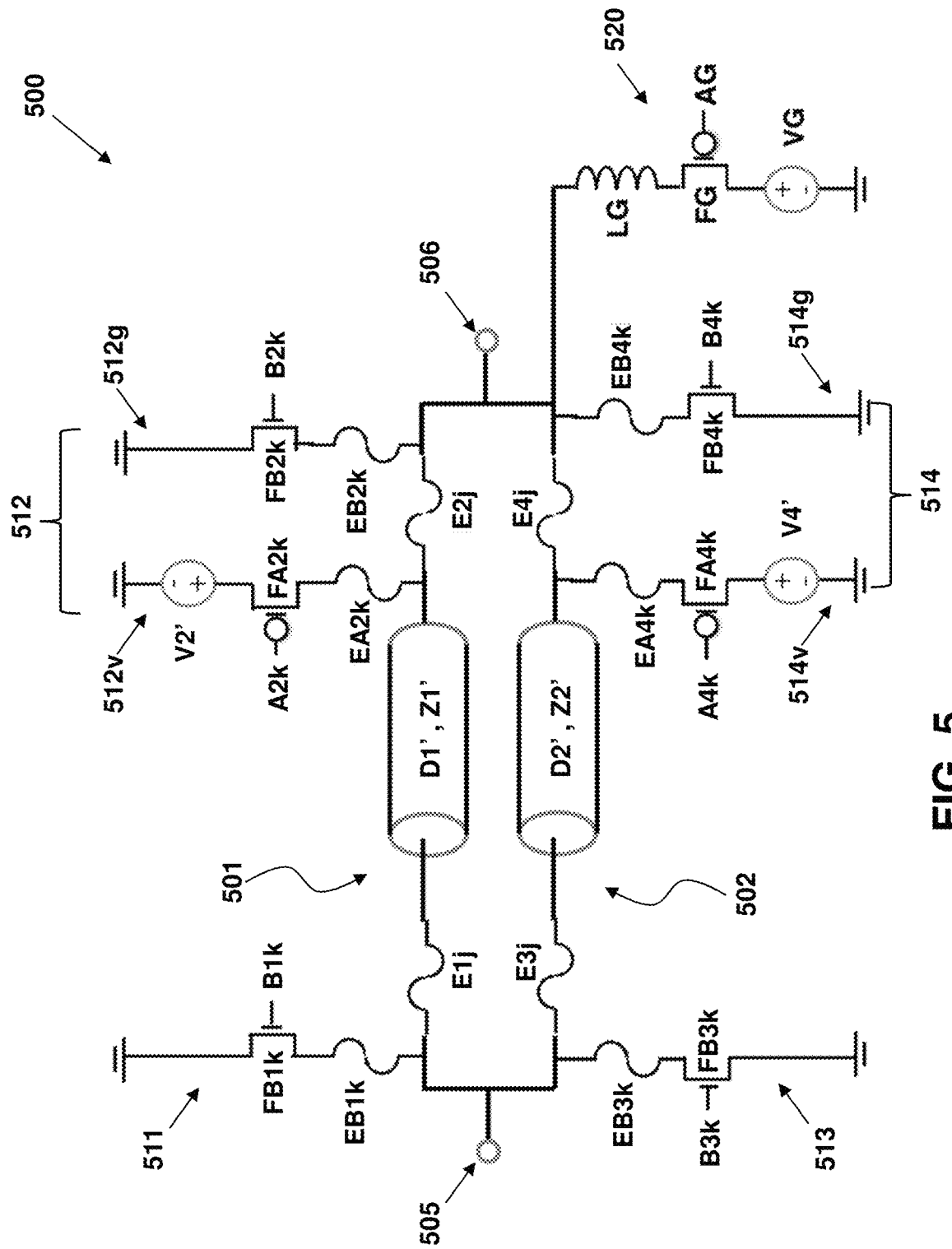
FIG. 5 shows a schematic diagram of a representative one of the phase shifter elements in accordance with aspects of a second embodiment.

FIG. 5 shows a schematic diagram of a representative phase shifter element 500 in accordance with aspects of a second embodiment. The phase shifter element 500 may be used as one of the phase shifter elements PSE-i,1, PSE-i,2, . . . , PSE-i,n of FIG. 3.

In accordance with aspects of the invention, the phase shifter element 500 is a two-path, e-fuse controlled switched-delay line phase shifter element. In embodiments, the phase shifter element 500 comprises a first signal path 501 and a second signal path 502 extending between an input node 505 and an output node 506. In a particular embodiment, the first signal path 501 and a second signal path 502 are arranged in parallel to one another between the nodes 505, 506.

The first signal path 501 has a first delay D1' and a first characteristic impedance Z1'. The second signal path 502 has a second delay D2' and a second characteristic impedance Z2'. In embodiments, the first characteristic impedance Z1' is substantially equal to the second characteristic impedance Z2', e.g., within a tolerance of less than 1% difference. In a particular example, Z1'=Z2'=50 Ohms.

According to aspects of the invention, the first delay D1' is different than the second delay D2', delay being the time required for a signal to travel along the respective path from the first node 505 to the second node 506. In embodiments, the difference between D1' and D2' is achieved by making the paths 501 and 502 have different physical lengths. In one example, each path 501 and 502 has identical physical characteristics per unit length (e.g., type of line, cross section, material, etc.), and the paths 501 and 502 have different physical lengths. In this example, due to the identical physical characteristics per unit length and different physical lengths, it would take a signal a first amount of time to travel between nodes 505 and 506 along first path 501, and it would take the same signal a second amount of time, different than the first amount of time, to travel between nodes 505 and 506 along second path 502. The paths 501 and 502 may be constructed using microstrip, stripline, coplanar waveguide (CPW), or slow-wave transmission lines, for example. The paths 501 and 502 may be formed in a layered semiconductor structure or a printed circuit board, for example. In a particular embodiment, the paths 501 and 502 are specifically structured and arranged to transmit RF signals used in RF communication systems.

Still referring to FIG. 5, in accordance with aspects of the invention, the phase shifter element 500 is programmable using e-fuses to select one of paths 501 and 502 for carrying a signal between nodes 505 and 506. In embodiments, each path 501 and 502 comprises at least one e-fuse in the path that, when blown, creates a physical discontinuity in the path and, thus, creates an electrical discontinuity in the path between the nodes 505 and 506. The phase shifter element 500 can be programmed to select path 501 by blowing the at least one e-fuse in path 502 and not blowing the at least one e-fuse in the path 501. Alternatively, the phase shifter element 500 can be programmed to select path 502 by blowing the at least one e-fuse in path 501 and not blowing the at least one e-fuse in the path 502. Since the different paths 501 and 502 have different delay values D1' and D2', the act of selecting one path comprises selecting one of the different delay values for this particular phase shifter element. When plural ones of the phase shifter elements 500 are arranged in series, e.g., the respective phase shifter elements 500 corresponding to respective ones of the phase shifter elements PSE-i,1, PSE-i,2, . . . , PSE-i,n in a phase shifter PS-i of FIG. 3, each of the respective phase shifter elements 500 can be individually programmed to provide a predefined amount of delay for the phase shifter PS-i as a whole. Moreover, because phase change of a signal is a function of the delay, the phase shifter PS-i using plural phase shifter elements 500 can be programmed to provide a predefined amount of phase change to a signal based on the predefined amount of delay.

With continued reference to FIG. 5, in embodiments the first path 501 includes first e-signal path fuse E1j, a second signal path e-fuse E2j, first control line 511, and second control lines 512. In embodiments, the second path 502 includes third signal path e-fuse E3j, a fourth signal path e-fuse E4j, third control line 513, and fourth control lines 514. The control lines 511, 512, 513, 514 are formed using electrically conductive material, such as metal in a layered semiconductor structure or a printed circuit board, for example.

In the example shown in FIG. 5, the first control line 511 includes a switch FB1k (e.g., a FET controllable by signal B1k) and a control path e-fuse EB1k arranged in series between ground and a location on the first path 501 between the node 505 and the first e-fuse E1j. Similarly, the third control line 513 includes a switch FB3k (e.g., a FET controllable by signal B3k) and a control path e-fuse EB3k arranged in series between ground and a location on the second path 502 between the node 505 and the third e-fuse E3j.

Still referring to the example shown in FIG. 5, the second control lines 512 include voltage line 512v and ground line 512g, with the second e-fuse E2j connected in series between the voltage line 512v and the ground line 512g. In embodiments, the voltage line 512v includes a DC voltage source V2', a switch FA2k (e.g., a FET controllable by signal A2k), and a control path e-fuse EA2k arranged in series between ground and a location on the first path 501 between the first e-fuse E1j and the second e-fuse E2j. In embodiments, the ground line 512g includes a switch FB2k (e.g., a FET controllable by signal B2k) and a control path e-fuse EB2k arranged in series between ground and a location on the first path 501 between the second e-fuse E2j and the node 506.

Similarly, the fourth control lines 514 include voltage line 514v and ground line 514g, with the fourth e-fuse E4j connected in series between the voltage line 514v and the ground line 514g. In embodiments, the voltage line 514v includes a DC voltage source V4', a switch FA4k (e.g., a FET controllable by signal A4k), and a control path e-fuse EA4k arranged in series between ground and a location on the second path 502 between the third e-fuse E3j and the fourth e-fuse E4j. In embodiments, the ground line 514g includes a switch FB4k (e.g., a FET controllable by signal B4k) and a control path e-fuse EB4k arranged in series between ground and a location on the second path 502 between the fourth e-fuse E4j and the node 506.

With continued reference to the example shown in FIG. 5, in embodiments the phase shifter element 500 includes an auxiliary control line 520 that includes a DC voltage source VG, a switch FG (e.g., a FET controllable by signal AG), and an inductor LG arranged in series between ground and the node 506.

Still referring to the example shown in FIG. 5, in embodiments the phase shifter element 500 can be programmed one time to select either path 501 or path 502. To select path 501, the third e-fuse E3j and fourth e-fuse E4j are blown in the manner described herein, and the first e-fuse E1j and the second e-fuse E2j are not blown. In this manner, path 501 extends continuously between nodes 505 and 506, while path 502 has discontinuities where the third e-fuse E3j and fourth e-fuse E4j are blown. Conversely, to select path 502, the first e-fuse E1j and the second e-fuse E2j are blown in the manner described herein, and the third e-fuse E3j and fourth e-fuse E4j are not blown. In this manner, path 502 extends continuously between nodes 505 and 506, while path 501 has discontinuities where the first e-fuse E1j and the second e-fuse E2j are blown. In this manner, the phase shifter element 500 can be programmed one time to select a first delay value (e.g., D1' of path 501) or a second delay value (e.g., D2' of path 502). In embodiments, the system includes control circuitry that is configured to control the signals A2k, A4k, B1k, B2k, B3k, B4k, AG to program the phase shifter element 500. The control circuitry may be included in a phased array antenna system 10 that includes the phase shifter element 500.

In embodiments, after programming the phase shifter element 500 to select either path 501 or path 502, the phase shifter element 500 is further modified by blowing all the control path e-fuses EB1k, EA2k, EB2k, EB3k, EA4k, EB4k. Doing so prevents a signal traveling between nodes 505 and 506 (along path 501 or 502) from traveling down any of the control lines 511, 512, 513, 514.

Figure 6:
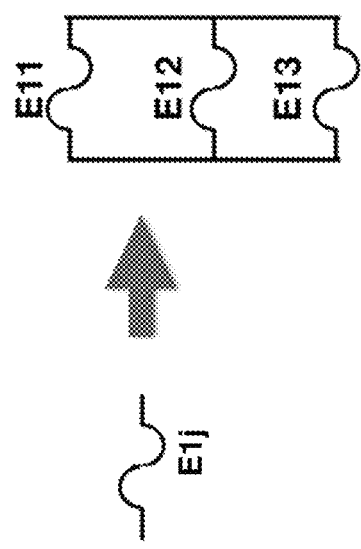
FIG. 6 shows an exemplary implementation of a signal path e-fuse used in the phase shifter element of FIG. 5 in accordance with aspects of the invention.

FIG. 6 shows an exemplary implementation of a signal path e-fuse used in the phase shifter element 500 of FIG. 5. In embodiments, each of the signal path e-fuses (e.g., first e-fuse E1j, second e-fuse E2j, third e-fuse E3j, and fourth e-fuse E4j) includes plural e-fuses arranged in parallel. For example, as shown in FIG. 6, first e-fuse E1j may include plural individual e-fuses E11, E12, and E13 connected in parallel. The second e-fuse E2j, third e-fuse E3j, and fourth e-fuse E4j may have similar construction as that shown in FIG. 6. In embodiments, the number "j" of e-fuses arranged in parallel is the same for each of the signal path e-fuses (e.g., first e-fuse E1j, second e-fuse E2j, third e-fuse E3j, and fourth e-fuse E4j).

Figure 7:
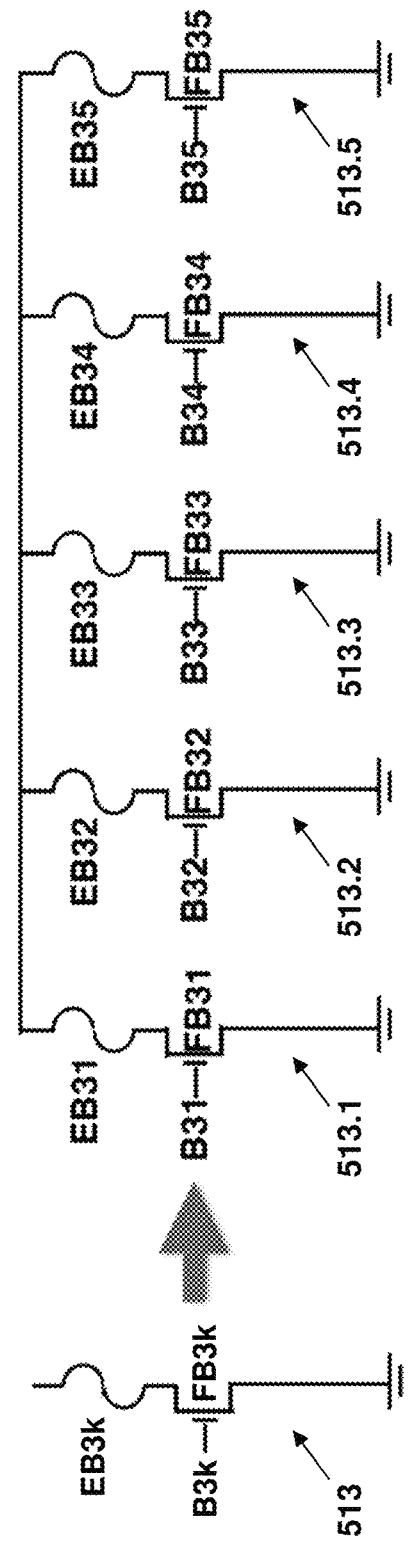
FIG. 7 shows an exemplary implementation of a control path e-fuse used in the phase shifter element of FIG. 5 in accordance with aspects of the invention.

FIG. 7 shows an exemplary implementation of a control path e-fuse used in the phase shifter element 500 of FIG. 5. In embodiments, each of the control lines 511, 512v, 512g, 513, 514v, 514g comprises plural lines arranged in parallel. For example, as shown in FIG. 7, the third control line 513 includes plural identical lines 513.1, 513.2, 513.3, 513.4, 513.5 arranged in parallel between ground and the location on the second path 502 between the node 505 and the third e-fuse E3j. In the example shown in FIG. 7, each of the lines 513.1, 513.2, 513.3, 513.4, 513.5 includes a switch (e.g., one of FB31, FB32, FB33, FB34, FB35) and an e-fuse (e.g., one of EB31, EB32, EB33, EB34, EB35). The control lines 511, 512g, and 514g may have similar construction as that shown in FIG. 7. The control lines 512v and 514v may have similar construction as that shown in FIG. 7 with the addition that the parallel lines in control line 512v are all connected to DC voltage source V2', and the parallel lines in control line 514v are all connected to DC voltage source V4'. In embodiments, the number "k" is the same for each of the control lines 511, 512v, 512g, 513, 514v, 514g.

Referring now to FIGS. 6 and 7, in embodiments the number "j" in FIG. 6 is less than the number "k" in FIG. 7. By designing the circuit with "j" less than "k" the signal path e-fuses will blow before the control path e-fuses. In one non-limiting example, the number "j" is 3 and the number "k" is 5, although other implementations may be used where "j" is less than "k".

An exemplary sequence of steps for programming the phase shifter element 500 to select the first path 501 is described to illustrate aspects of the invention. All switches in the phase shifter element 500 are switched off at the outset, and individual switches are then switched on and off as described in the following steps.

First, V2' and V4' are set to high (e.g., a high voltage state as opposed to a low/zero voltage state).

Next, all switches FB3k are switched on (e.g., using control signals B3k) and all switches FA4k are switched on (e.g., using control signals A4k), with the result being that current flows from V4' to the ground of line 513, thereby blowing all e-fuses E3j but not blowing e-fuses EA4k and not blowing e-fuses EB3k.

Next, all switches FB3k are switched off (e.g., using control signals B3k) and all switches FA4k are switched off (e.g., using control signals A4k).

Next, all switches FA4k are switched on (e.g., using control signals A4k) and all switches FB4k are switched on (e.g., using control signals B4k), with the result being that current flows from V4' to the ground of line 514g, thereby blowing all e-fuses E4j but not blowing e-fuses EA4k and not blowing e-fuses EB4k.

Next, all switches FA4k are switched off (e.g., using control signals A4k) and all switches FB4k are switched off (e.g., using control signals B4k).

Next, VG is set to high and switch FG is switched on (e.g., using control signal AG).

Next, each switch FB1k is switched on individually (e.g., using control signals B1k) to blow its associated e-fuse EB1k. For example, when "k" equals 5 as in FIG. 7, this step includes: switching on switch FB11 to blow e-fuse EB11; then switching on switch FB12 to blow e-fuse EB12; then switching on switch FB13 to blow e-fuse EB13; then switching on switch FB14 to blow e-fuse EB14; and then switching on switch FB15 to blow e-fuse EB15. By controlling the switches in this manner, each of the e-fuses EB1k is blown one at a time.

Next, each switch FB2k is switched on individually (e.g., using control signals B2k) to blow its associated e-fuse EB2k. This may be done in a manner similar to that described with respect to blowing e-fuses EB1k.

Next, each switch FB3k is switched on individually (e.g., using control signals B3k) to blow its associated e-fuse EB3k. This may be done in a manner similar to that described with respect to blowing e-fuses EB1k.

Next, each switch FB4k is switched on individually (e.g., using control signals B4k) to blow its associated e-fuse EB4k. This may be done in a manner similar to that described with respect to blowing e-fuses EB1k.

Next, each switch FB1k is switched off, each switch FB2k is switched off, each switch FB3k is switched off, and each switch FB4k is switched off using the appropriate control signals.

Next, VG is set to low with switch FG on. Switch FG may be left on from the previous steps or may switched off and then on again after setting VG to low. In either event, VG is now low while switch FG is on.

Next, each switch FA2k is switched on individually (e.g., using control signals A2k) to blow its associated e-fuse EA2k. This may be done in a manner similar to that described with respect to blowing e-fuses EB1k.

Next, each switch FA2k is switched off.

Next, FG is switched off.

Using this sequence of steps, the signal path e-fuses E3j and E4j are blown, thus creating a discontinuity in the path 502 between input 505 and output 506. Conversely, the signal path fuses E1j and E2j are not blown, meaning that there is a continuous electrical path along path 501 between input 505 and output 506. By using in this sequence of steps, control path e-fuses EB1k, EB2k, EB3k, EB4k, and EA2k are also blown, thus creating discontinuities in those control lines 511, 512g, 513, 514g, and 512v, thus preventing the signal from traveling down any of these control lines. The control path e-fuses EA4k are not blown; however, the signal cannot reach line 514v because signal path e-fuses E3j and E4j are blown.

Figure 8:
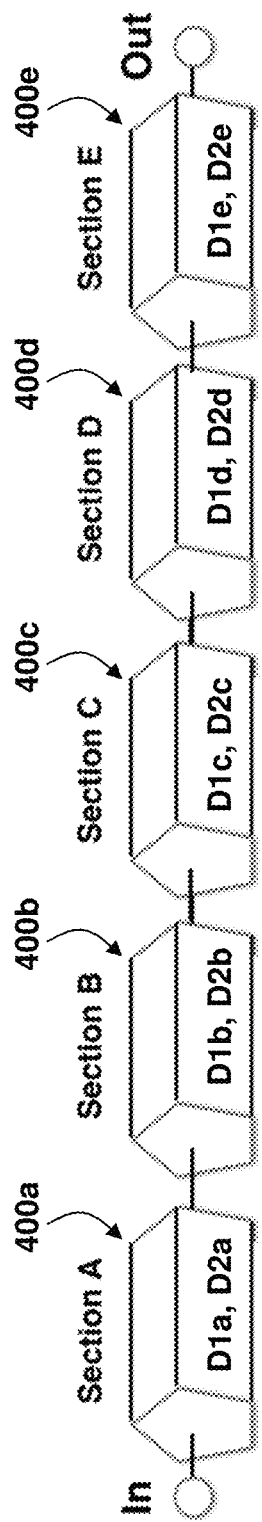
FIG. 8 shows an exemplary implementation of a phase shifter comprising a number of phase shifter elements of FIG. 4 in accordance with aspects of the invention.

FIG. 8 shows an exemplary implementation of a phase shifter comprising a number of phase shifter elements of FIG. 4 arranged in series. In the example shown in FIG. 8, there are five phase shifter elements 400a, 400b, 400c, 400d, 400e connected in series, e.g., in the manner similar to the phase shifter elements PSE-i,1, PSE-i,2, . . . , PSE-i,n connected in series in a phase shifter PS-i shown in FIG. 3. In this example, each of the phase shifter elements 400a, 400b, 400c, 400d, 400e has the structure of the phase shifter elements 400 shown in FIG. 4, but with different delay values as described here with respect to FIG. 8. In this example, the delays values (e.g., D1 and D2) of the phase shifter elements 400a, 400b, 400c, 400d, 400e are configured such that the phase change of one of the phase shifter elements on the right is half as much as the phase change of its adjacent neighbor on the left. Using five phase shifter elements in this manner provides for 5-bit control, which provides for 180 degrees conditional phase possible across all five phase shifter elements in N=32 increments of about 5.8 degrees each. The term "about" in this sense means within conventional manufacturing tolerances for such structures (e.g., about 5.8 degrees means 5.8 degrees plus or minus an amount within conventional manufacturing tolerances for the type of transmission line used). Table 1 shows the conditional phase change per phase shifter elements 400a, 400b, 400c, 400d, 400e in this example.

TABLE 1

| Phase shifter element | Conditional phase change for this element |
| --- | --- |
| Section E (element 400e) | 5.8 degrees |
| Section D (element 400d) | 11.6 degrees |
| Section C (element 400c) | 23.2 degrees |
| Section B (element 400b) | 46.4 degrees |
| Section A (element 400a) | 92.8 degrees |

As shown in Table 1, the phase shifter element 400e may be programmed to impart either a reference phase change of 0 degrees or a phase change of 5.8 degrees relative to the reference phase change, e.g., by programming to use either the first path or the second path within the phase shifter element 400e in the manner described with respect to FIG. 4. In this example, the phase shifter element 400e has a first path (e.g., path 401 of FIG. 4) having a delay of D1e and a second path (e.g., path 402 of FIG. 4) having a delay of D2e, where the difference between D1e and D2e corresponds to a phase change of 5.8 degrees in a signal traveling through the phase shifter element 400e. In this example, selecting the first path in the phase shifter element 400e imparts a reference phase change of 0.0 degrees in the signal, and selecting the second path in the phase shifter element 400e imparts a phase change of 5.8 degrees in the signal, the 5.8 degrees being a difference in phase change relative to the reference phase change of 0.0 degrees. In this manner the phase shifter element 400e may be programmed one time, by blowing the appropriate e-fuses to select either the first path or the second path, to provide a reference phase change of 0.0 degrees or a phase change of 5.8 degrees of relative to the reference phase change of 0.0 degrees. As used herein, the term reference phase change is a phase change that is measured relative to a nominal phase change that is physically present in each of the first and second paths (e.g., paths 401 and 402). In this example, the phase change in the first path is the nominal phase change plus 0.0 degrees, and the phase change in the second path is the nominal phase change plus 5.8 degrees.

With continued reference to Table 1 and FIG. 8, the phase shifter element 400d in this example has a first path (e.g., path 401 of FIG. 4) having a delay of D1d and a second path (e.g., path 402 of FIG. 4) having a delay of D2d, where the difference between D1d and D2d corresponds to a phase change of 11.6 degrees in a signal traveling through the phase shifter element 400d. In this manner, the phase shifter element 400d may be programmed to impart either a reference phase change of 0 degrees or a phase change of 11.6 degrees relative to the reference phase change of 0 degrees, e.g., by programming to use either the first path or the second path within the phase shifter element 400d in the manner described with respect to FIG. 4.

With continued reference to Table 1 and FIG. 8, the phase shifter element 400c in this example has a first path (e.g., path 401 of FIG. 4) having a delay of D1c and a second path (e.g., path 402 of FIG. 4) having a delay of D2c, where the difference between D1c and D2c corresponds to a phase change of 23.2 degrees in a signal traveling through the phase shifter element 400c. In this manner, the phase shifter element 400c may be programmed to impart either a reference phase change of 0 degrees or a phase change of 23.2 degrees relative to the reference phase change of 0 degrees, e.g., by programming to use either the first path or the second path within the phase shifter element 400c in the manner described with respect to FIG. 4.

With continued reference to Table 1 and FIG. 8, the phase shifter element 400b in this example has a first path (e.g., path 401 of FIG. 4) having a delay of D1b and a second path (e.g., path 402 of FIG. 4) having a delay of D2b, where the difference between D1b and D2b corresponds to a phase change of 46.4 degrees in a signal traveling through the phase shifter element 400b. In this manner, the phase shifter element 400b may be programmed to impart either a reference phase change of 0 degrees or a phase change of 46.4 degrees relative to the reference phase change of 0 degrees, e.g., by programming to use either the first path or the second path within the phase shifter element 400b in the manner described with respect to FIG. 4.

With continued reference to Table 1 and FIG. 8, the phase shifter element 400a in this example has a first path (e.g., path 401 of FIG. 4) having a delay of D1a and a second path (e.g., path 402 of FIG. 4) having a delay of D2a, where the difference between D1a and D2a corresponds to a phase change of 92.8 degrees in a signal traveling through the phase shifter element 400a. In this manner, the phase shifter element 400a may be programmed to impart either a reference phase change of 0 degrees or a conditional phase change of 92.8 degrees relative to the reference phase change of 0 degrees, e.g., by programming to use either the first path or the second path within the phase shifter element 400a in the manner described with respect to FIG. 4.

With continued reference to Table 1 and FIG. 8, in this example, each of the five phase shifter elements 400a, 400b, 400c, 400d, 400e are constructed with respective delays along their two paths such that the relationship shown in Expression 1 is achieved.

$$(D2a-D1a)=2*(D2b-D1b)=4*(D2c-D1c)=8*(D2d-D1d)=16*(D2e-D1e) \qquad (1)$$

With continued reference to Table 1 and FIG. 8, in this example, each of the five phase shifter elements 400a, 400b, 400c, 400d, 400e has two programmable delay states (e.g., along first path or a second path as described herein) that are configured to provide the conditional phase change value shown in Table 1. These five phase shifter elements 400a, 400b, 400c, 400d, 400e constructed in this manner and connected in series combine to provide a phase shifter (e.g., a phase shifter PS-i shown in FIG. 3) that has 32 different programmable phase change states ranging from 0 degrees to 179.8 degrees in increments of 5.8 degrees.

Figure 9:
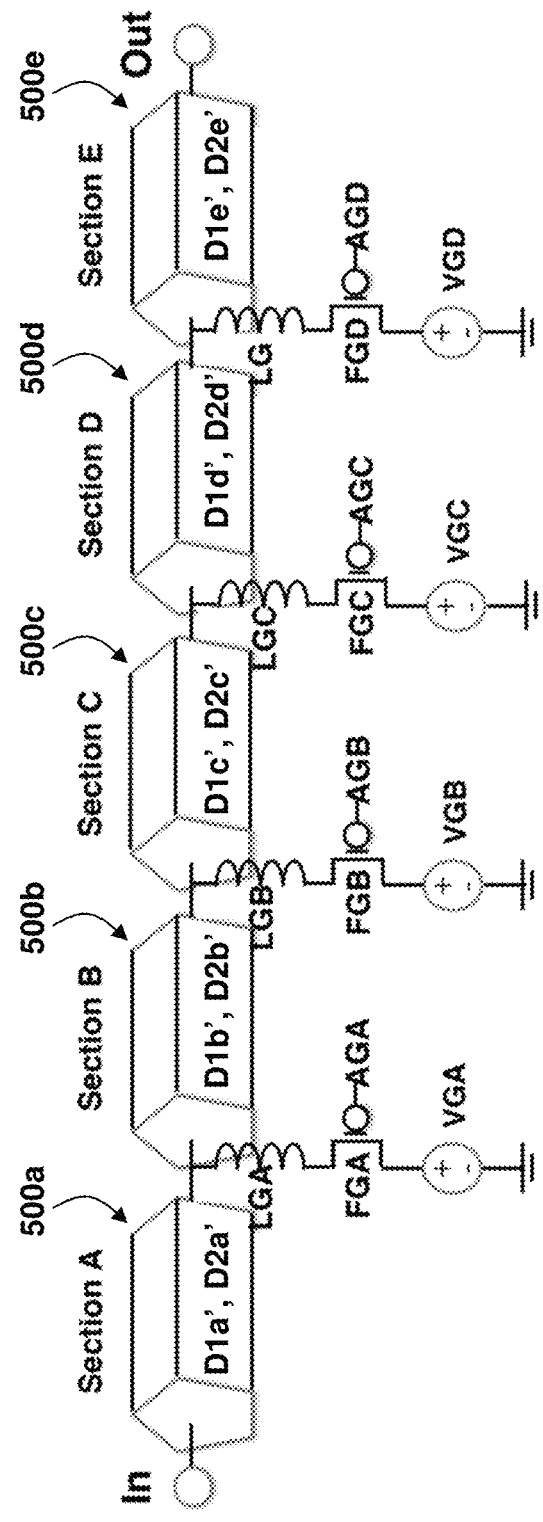
FIG. 9 shows an exemplary implementation of a phase shifter comprising a number of phase shifter elements of FIG. 5 in accordance with aspects of the invention.

FIG. 9 shows an exemplary implementation of a phase shifter comprising a number of phase shifter elements of FIG. 5 arranged in series. In the example shown in FIG. 9, there are five phase shifter elements 500a, 500b, 500c, 500d, 500e connected in series, e.g., in the manner similar to the phase shifter elements PSE-i,1, PSE-i,2, . . . , PSE-i,n connected in series in a phase shifter PS-i shown in FIG. 3. In this example, each of the phase shifter elements 500a, 500b, 500c, 500d, 500e has the structure of the phase shifter elements 500 shown in FIG. 5, but with different delay values as described here with respect to FIG. 9.

In the example shown in FIG. 9, the phase shifter includes the phase shifter elements 500a, 500b, 500c, 500d, 500e and plural auxiliary control lines 520a, 520b, 520c, 520d, each of which may be constructed in a manner similar to auxiliary control line 520 of FIG. 5, and which may be used to provide DC current to blow certain e-fuses within the phase shifter elements 500a, 500b, 500c, 500d, 500e in the manner described with respect to FIG. 5. In embodiments, by using plural auxiliary control lines 520a, 520b, 520c, 520d, there is less DC current passing through the signal path e-fuses of the phase shifter elements 500a, 500b, 500c, 500d, 500e during the programming sequence, since the DC current used in the programming sequence for any given one of the phase shifter elements 500a, 500b, 500c, 500d, 500e is provided by the nearest neighbor one of the auxiliary control lines 520a, 520b, 520c, 520d. Implementations are not limited to using inductors in the auxiliary control lines 520a, 520b, 520c, 520d, and any type of low-pass filter (extending to DC) may be used so long as the filter permits passage of the DC current and prevents passage of an RF signal.

In the example shown in FIG. 9, the delays values (e.g., D1' and D2') of the phase shifter elements 500a, 500b, 500c, 500d, 500e are configured such that the phase change of one of the phase shifter elements on the right is half as much as the phase change of its adjacent neighbor on the left. Using five phase shifter elements in this manner provides for 5-bit control, which provides for 180 degrees conditional phase possible across all five phase shifter elements in N=32 increments of about 5.8 degrees each. Table 2 shows the conditional phase change per phase shifter elements 500a, 500b, 500c, 500d, 500e in this example.

TABLE 2

| Phase shifter element | Conditional phase change for this element |
| --- | --- |
| Section E (element 500e) | 5.8 degrees |
| Section D (element 500d) | 11.6 degrees |
| Section C (element 500c) | 23.2 degrees |
| Section B (element 500b) | 46.4 degrees |
| Section A (element 500a) | 92.8 degrees |

With continued reference to Table 1 and FIG. 8, in this example, each of the five phase shifter elements 400a, 400b, 400c, 400d, 400e are constructed with respective delays along their two paths such that the relationship shown in Expression 2 is achieved.

$$(D2a'-D1a')=2*(D2b'-D1b')=4*(D2c'-D1c')=8*(D2d'-D1d')=16*(D2e'-D1e') \quad (2)$$

In this example of FIG. 9, each of the five phase shifter elements 500a, 500b, 500c, 500d, 500e has two programmable delay states (e.g., along first path or a second path as described herein) that are configured to provide the conditional phase change value shown in Table 2. In a manner similar to that described with respect to FIG. 8 and Table 1, the five phase shifter elements 500a, 500b, 500c, 500d, 500e constructed according to FIG. 9 and Table 2 combine to provide a phase shifter (e.g., a phase shifter PS-i shown in FIG. 3) that has 32 different programmable phase change states ranging from 0 degrees to 179.8 degrees in increments of 5.8 degrees.

Figure 10:
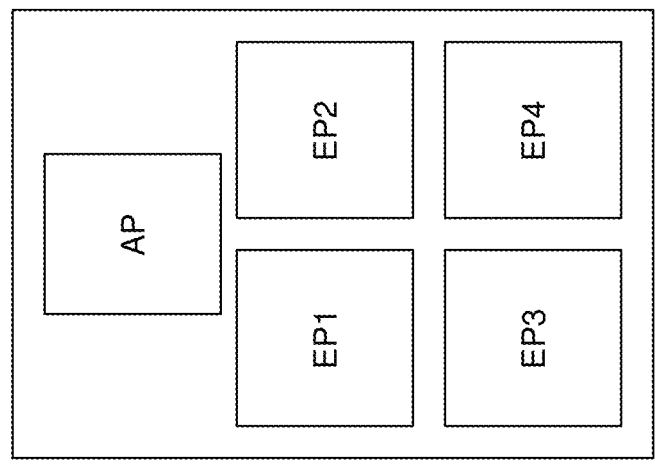
FIG. 10 shows a module including plural e-fuse switched-path phased arrays in accordance with aspects of the invention.

FIG. 10 shows a module including plural e-fuse switched-path phased arrays in accordance with aspects of the invention. In embodiments, the module 1000 includes four e-fuse switched-path phased arrays EP1, EP2, EP3, EP4 and one active phased array AP. In one embodiment, each of the e-fuse switched-path phased arrays EP1, EP2, EP3, EP4 includes a phased array antenna system 10 as shown in FIGS. 1 and 2, where each phase shifter PS-1, PS-2, . . . , PS-i includes a number of phase shifter elements 400 of FIG. 4. For example, each of the phase shifters PS-1, PS-2, . . . , PS-i in each of the e-fuse switched-path phased arrays EP1, EP2, EP3, EP4 may include five phase shifter elements 400a, 400b, 400c, 400d, 400e as shown in FIG. 8. In another embodiment, each of the e-fuse switched-path phased arrays EP1, EP2, EP3, and EP4 includes a phased array antenna system 10 as shown in FIGS. 1 and 2, where each phase shifter PS-1, PS-2, . . . , PS-i includes a number of phase shifter elements 500 of FIG. 5. For example, each of the phase shifters PS-1, PS-2, . . . , PS-i in each of the e-fuse switched-path phased arrays EP1, EP2, EP3, EP4 may include five phase shifter elements 500a, 500b, 500c, 500d, 500e as shown in FIG. 9.

In accordance with aspects of the invention, each of the e-fuse switched-path phased arrays EP1, EP2, EP3, EP4 may be programmed once to achieve a beam direction A defined by polar angle θ and azimuth angle φ as shown in FIG. 1.

In embodiments, the module 1000 uses only one of the e-fuse switched-path phased arrays EP1, EP2, EP3, EP4 at any given time to transmit and/or receive wireless communication signals. For example, when the module 1000 uses e-fuse switched-path phased array EP1 to transmit and/or receive, the other e-fuse switched-path phased arrays EP2, EP3, EP4 are not in use. In this manner, the module 1000 may program e-fuse switched-path phased array EP1 to achieve a first beam direction, and the module 1000 may use e-fuse switched-path phased array EP1 to transmit and/or receive using this first beam direction for a first amount of time. At a later time, the module may disable e-fuse switched-path phased array EP1 and program e-fuse switched-path phased array EP2 to achieve a second beam direction, and then use e-fuse switched-path phased array EP2 to transmit and/or receive using the second beam direction for a second amount of time. Similarly, the module may disable e-fuse switched-path phased array EP2 and then program and use e-fuse switched-path phased array EP3, and may later disable e-fuse switched-path phased array EP3 and then program and use e-fuse switched-path phased array EP4.

With continued reference to FIG. 10, in embodiments the active phased array AP comprises an actively tunable phase shifter that either has its own set of antenna elements 15-1, 15-2, . . . , 15-i, or is selectively connected to the respective antenna elements 15-1, 15-2, . . . , 15-i of each of the e-fuse switched-path phased arrays EP1, EP2, EP3, EP4. In embodiments, the active phased array AP comprises a conventional phase shifter that is capable of automatically determining a direction of the phased array antenna system 10 as defined by particular a combination of values of angles θ and φ. Such automatic determination of a direction of a phased array antenna system is sometimes referred to as "self-installation" and/or "tracking" and is described, for example, in United States Patent Application Publication No. 2019/0089434, published Mar. 21, 2019, the contents of which are expressly incorporated by reference herein in their entirety.

Still referring to FIG. 10, in embodiments the module 1000 comprises control circuitry that is configured to receive data from the active phased array AP, the data defining a direction of a beam of a phased array antenna system as defined by particular a combination of values of angles θ and φ. Using this data, the control circuitry of the module 1000 provides respective control signals to the phase shifters PS-1, PS-2, . . . , PS-i of one of the e-fuse switched-path phased arrays EP1, EP2, EP3, EP4 currently being programmed. The control signals cause programming circuits in the phase shifter elements PSE-i,1, PSE-i,2, . . . , PSE-i,n to perform the one-time programming of the appropriate e-fuses in the phase shifter elements PSE-i,1, PSE-i,2, . . . , PSE-i,n to select one path or the other within each of the phase shifter elements (e.g., as described with respect to FIG. 4 or FIG. 5), to provide overall phase changes for each of the phase shifters PS-1, PS-2, . . . , PS-i that combine to achieve a beam in the direction defined by the combination of values of angles θ and φ received from the active phased array AP.

In this manner, the active phased array AP is used to automatically determine a direction of a beam for one of the e-fuse switched-path phased arrays EP1, EP2, EP3, EP4 being programmed and, based on this determination, the control circuitry of the module 1000 programs certain ones of the e-fuses in the phase shifter elements PSE-i,1, PSE-i,2, . . . , PSE-i,n of the one of the e-fuse switched-path phased arrays EP1, EP2, EP3, EP4 being programmed (using techniques described in FIG. 4 or FIG. 5), thereby applying appropriate phase shifts within the one of the e-fuse switched-path phased arrays EP1, EP2, EP3, EP4 being programmed to achieve the direction determined by the active phased array AP.

In this embodiment, after the one-time programming of the e-fuses in the phase shifter elements PSE-i,1, PSE-i,2, . . . , PSE-i,n, the active phased array AP is tuned OFF to reduce the power used by the system. The active phased array AP may be formed on-chip with the e-fuse switched-path phased arrays EP1, EP2, EP3, EP4, e.g., on the same module 1000.

Aspects of the invention are not limited to four e-fuse switched-path phased arrays EP1, EP2, EP3, EP4 in the module 1000, and other numbers may be used. In some applications, such as remote sensors or fixed-direction wireless access points, it may be sufficient to have only one e-fuse switched-path phased array in the module 1000. In embodiments, once one of the e-fuse switched-path phased arrays is programmed and in use for transmitting and/or receiving wireless signals, the power consumption through that e-fuse switched-path phased array is significantly lower than the power used by active phased arrays. This reduced power consumption is advantageous for power-constrained remote sensors, and also is helpful in reducing wasted energy and allowing more energy efficient (e.g., "green") deployment of urban fixed-access wireless nodes.

Figure 11:
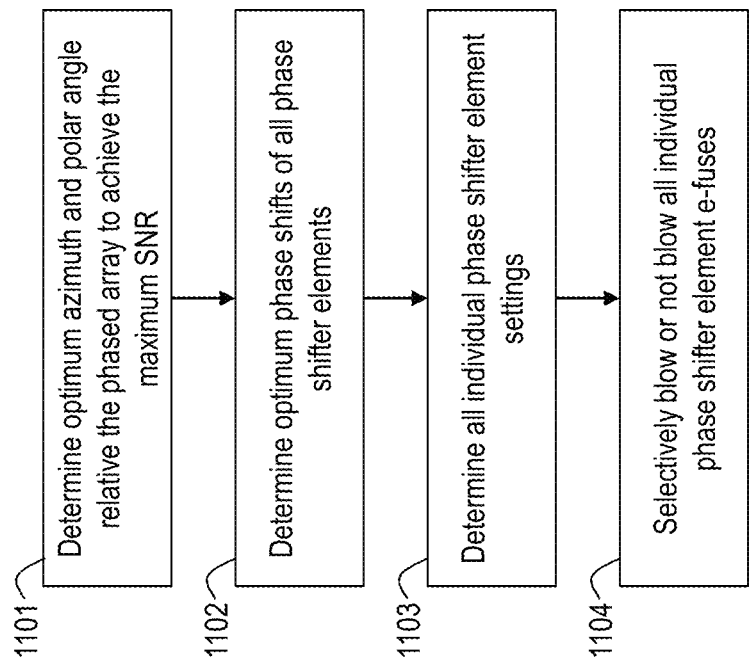
FIG. 11 shows a flowchart of an exemplary method in accordance with aspects of the invention.

FIG. 11 shows a flowchart of an exemplary method in accordance with aspects of the invention. In embodiments, the steps of the method are performed by or using elements already described herein, and the steps of the method are described using reference numbers of those elements when appropriate. The method may utilize module 1000 of FIG. 10, which may include plural e-fuse switched-path phased arrays EP1, EP2, EP3, EP4, each of which may include plural phase shifters comprising plural phase shifter elements 400 of FIG. 4 or plural phase shifter elements 500 of FIG. 5.

At step 1101, the system determines an optimum azimuth and polar angle relative the phased array to achieve the maximum SNR for one of the e-fuse switched-path phased arrays EP1, EP2, EP3, EP4 being programmed. Step 1101 may be performed automatically, e.g., using an active phased array AP as described with respect to FIG. 10.

At step 1102, the system determines optimum phase shifts of all the phase shifter elements PSE-i,1, PSE-i,2, . . . , PSE-i,n in the one of the e-fuse switched-path phased arrays EP1, EP2, EP3, EP4 being programmed. In embodiments, the control circuitry of the module 1000 includes logic that is configured to determine optimum phase shifts of all the phase shifter elements PSE-i,1, PSE-i,2, . . . , PSE-i,n in each of the phase shifters PS-1, PS-2, . . . , PS-i of the one of the e-fuse switched-path phased arrays EP1, EP2, EP3, EP4 being programmed, to achieve the azimuth angle φ and polar angle θ from step 1101.

At step 1103, the system determines all individual phase shifter element settings. In embodiments, the control circuitry of the module 1000 includes logic that is configured to determine which path to select in each of the phase shifter elements PSE-i,1, PSE-i,2, . . . , PSE-i,n to achieve the phase shifts determined at step 1102. In embodiments, the control circuitry of the module 1000 uses data similar to that shown in Table 1 and/or Table 2 to determine which path to select in each phase shifter element of a phase shifter in order to achieve the determined phase shift for the phase shifter that, in combination with the determined phase shifts of the phase shifters, results in a beam with the determined azimuth angle φ and polar angle θ from step 1101.

At step 1104, the system selectively blows certain ones of the e-fuses in each of the phase shifter elements PSE-i,1, PSE-i,2, . . . , PSE-i,n to program each of the phase shifter elements PSE-i,1, PSE-i,2, . . . , PSE-i,n with the path determined at step 1103. In embodiments, the control circuitry of the module 1000 performs this programming of each of the phase shifter elements PSE-i,1, PSE-i,2, . . . , PSE-i,n in each of the phase shifters PS-1, PS-2, . . . , PS-i of the one of the e-fuse switched-path phased arrays EP1, EP2, EP3, EP4 being programmed, based on the paths determined at step 1103 to achieve the desired beam direction for this one of the e-fuse switched-path phased arrays EP1, EP2, EP3, EP4 being programmed.

Figure 12:
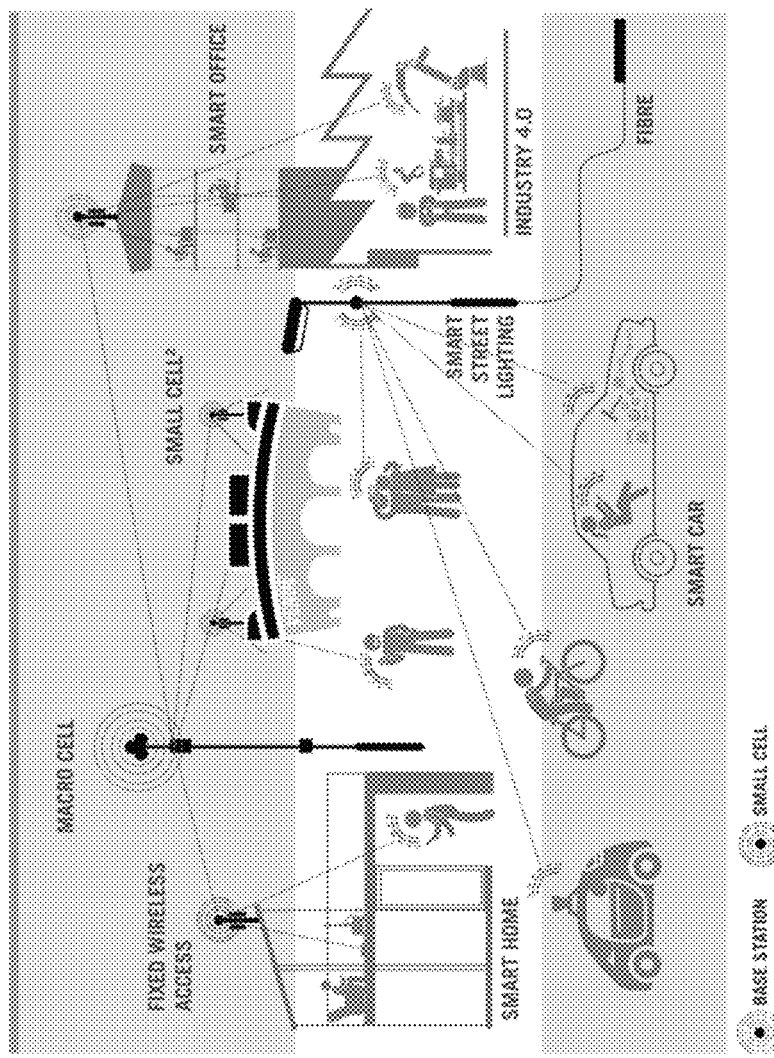
FIG. 12 shows an exemplary use case of the e-fuse switched-path phased arrays in accordance with aspects of the invention.

FIG. 12 shows an exemplary use case of the e-fuse switched-path phased arrays in accordance with aspects of the invention. FIG. 12 shows an example urban 5G wireless network environment 1200 that includes active and fixed-direction wireless access points. Installing fixed direction wireless access points without implementations of the invention requires specialized training to spend significant time during which the fixed-direction wireless access modules are set up in the environment 1200. However, by using the e-fuse switched-path phased arrays in accordance with aspects of the invention, such as module 1000 of FIG. 10, the direction of the phased array is determined and set automatically (e.g., as described with respect to FIGS. 10 and 11), thereby requiring only that the technician firmly secure the module 1000 to the wireless access point structure (e.g., light post, building, etc.) so that the module 1000 is immobile and, ideally, has a clear line of sight to the macro cell. As a result, the network setup requires a less skilled technician. Moreover, the network that is arranged in this manner consumes less power than a network that consists only of all active tunable antennas.

In accordance with further aspects of the invention, there is a method of manufacturing a phase shifter element 400 or 500 as described herein. In accordance with further aspects of the invention, there is a method of manufacturing a phased array antenna that includes phase shifter elements 400 or 500 as described herein. In accordance with further aspects of the invention, there is a method of manufacturing a module 1000 as described herein. The structures of the present invention, including the phase shifter element PSE-i,n comprising e-fuses, can be manufactured in a number of ways using a number of different tools. In some embodiments that utilize semiconductor structures, the methodologies and tools are used to form structures with dimensions in the micrometer and nanometer scale. The methodologies, i.e., technologies, employed to manufacture the structures of the present invention have been adopted from integrated circuit (IC) technology. For example, the structures of the present invention are built on wafers and are realized in films of material patterned by photolithographic processes on the top of a wafer. In particular, the fabrication of the structures of the present invention uses three basic building blocks: (i) deposition of thin films of material on a substrate, (ii) applying a patterned mask on top of the films by photolithographic imaging, and (iii) etching the films selectively to the mask.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A phase shifter element, comprising:
   a first signal path and a second signal path extending in parallel between an input node of the phase shifter element and an output node of the phase shifter element;
   at least one first signal path e-fuse in the first signal path; and
   at least one second signal path e-fuse in the second signal path, wherein the phase shifter element is programmable to select one of the first signal path and the second signal path; and
   the phase shifter element has a first phase shift when the first signal path is selected and a second phase shift, different than the first phase shift, when the second signal path is selected.

2. The phase shifter element of claim 1, wherein:
   the first signal path is selected by blowing the at least one second signal path e-fuse in the second signal path; and
   the second signal path is selected by blowing the at least one first signal path e-fuse in the first signal path.

3. The phase shifter element of claim 1, wherein the first signal path has a first delay and the second signal path has a second delay that is different than the first delay.

4. The phase shifter element of claim 3, wherein:
   the first signal path and the second signal path have identical physical characteristics per unit length;
   the first signal path has a first length extending from the input node of the phase shifter element to the output node of the phase shifter element; and
   the second signal path has a second length, different than the first length, extending from the input node of the phase shifter element to the output node of the phase shifter element.

5. The phase shifter element of claim 1, wherein:
   the at least one first signal path e-fuse in the first signal path comprises a first e-fuse and a second e-fuse in series in the first signal path; and
   the at least one second signal path e-fuse in the second signal path comprises a third e-fuse and a fourth e-fuse in series in the second signal path.

6. The phase shifter element of claim 5, further comprising:
   first control lines connected to the first signal path and configured to blow the first e-fuse by applying a first current to the first e-fuse;
   second control lines connected to the first signal path and configured to blow the second e-fuse by applying a second current to the second e-fuse;
   third control lines connected to the second signal path and configured to blow the third e-fuse by applying a third current to the third e-fuse; and
   fourth control lines connected to the second signal path and configured to blow the fourth e-fuse by applying a fourth current to the fourth e-fuse.

7. The phase shifter element of claim 6, wherein each of the first control lines, the second control lines, the third control lines, and the fourth control lines comprises a low pass filter that permits passage of a DC current and prevents passage of a radio frequency (RF) signal.

8. The phase shifter element of claim 5, further comprising:
   a first control line connected to the first signal path and usable to blow the first e-fuse;
   second control lines connected to the first signal path and usable to blow the second e-fuse;
   a third control line connected to the second signal path and usable to blow the third e-fuse;
   fourth control lines connected to the second signal path and usable to blow the fourth e-fuse; and
   an auxiliary control line that includes a DC voltage source and a low pass filter that permits passage of a DC current and prevents passage of a radio frequency (RF) signal, the auxiliary control line connected to either the first signal path or the second signal path.

9. The phase shifter element of claim 8, wherein each of the first control line, the second control lines, the third control line, and the fourth control lines comprises a respective control path e-fuse.

10. The phase shifter element of claim 8, wherein:
    each of the first e-fuse, the second e-fuse, the third e-fuse, and the fourth e-fuse comprises a number "j" of e-fuses connected in parallel; and
    each of the respective control path e-fuses, in each of the first control line, the second control lines, the third control line, and the fourth control lines, comprises a number "k" of e-fuses connected in parallel.

11. The phase shifter element of claim 10, wherein the number "k" is greater than the number "j".

12. A phase shifter comprising plural instances of the phase shifter element of claim 1 connected in series.

13. The phase shifter of claim 12, wherein the plural instances of the phase shifter element comprise:
    a first one of the phase shifter element structured such that a difference between the first phase shift and the second phase shift is about 5.8 degrees;
    a second one of the phase shifter element structured such that a difference between the first phase shift and the second phase shift is about 11.6 degrees;
    a third one of the phase shifter element structured such that a difference between the first phase shift and the second phase shift is about 23.2 degrees;
    a fourth one of the phase shifter element structured such that a difference between the first phase shift and the second phase shift is about 46.4 degrees; and
    a fifth one of the phase shifter element structured such that a difference between the first phase shift and the second phase shift is about 92.8 degrees.

14. A phased array antenna system comprising plural antennas, wherein each of the plural antennas is connected to a respective instance of the phase shifter of claim 12.

15. The phased array antenna system of claim 14, further comprising control circuitry that is configured to program each of the respective instances of the phase shifters to achieve a direction of a beam.

16. A module comprising the phased array antenna system of claim 15 and an active phased array that is configured to determine the direction of the beam.

17. A phased array antenna system, comprising:
- plural antennas each connected to one of plural phase shifters;
- wherein each of the plural phase shifter comprises plural phase shifter elements connected in series;
- wherein each respective one of the plural phase shifter elements comprises:
  - a first signal path and a second signal path extending in parallel between an input node of the respective phase shifter element and an output node of the respective phase shifter element;
  - at least one first signal path e-fuse in the first signal path; and
  - at least one second signal path e-fuse in the second signal path,
  - wherein the respective phase shifter element is programmable to select one of the first signal path and the second signal path; and
  - the respective phase shifter element has a first phase shift when the first signal path is selected and a second phase shift, different than the first phase shift, when the second signal path is selected.

18. The phased array antenna system of claim 17, further comprising control circuitry that is configured to program each respective one of the plural phase shifter elements to achieve a direction of a beam.

19. A module comprising the phased array antenna system of claim 18 and an active phased array that is configured to determine the direction of the beam.

20. A method, comprising:
- determining a desired direction of a phased array antenna; and
- selectively blowing e-fuses in plural phase shifter elements in plural phase shifters of the phased array antenna to set respective phase shifts in the plural phase shifters to achieve the desired direction of the phased array antenna,
- wherein each respective one of the plural phase shifter elements is programmable to select one of a first signal path and a second signal path; and
- the respective one of the plural phase shifter elements has a first phase shift when the first signal path is selected and a second phase shift, different than the first phase shift, when the second signal path is selected.

* * * * *